United States Patent
Ogawa et al.

(10) Patent No.: US 6,916,705 B2
(45) Date of Patent: Jul. 12, 2005

(54) SEMICONDUCTOR MEMORY AND METHOD FOR FABRICATING THE SAME

(75) Inventors: Hisashi Ogawa, Osaka (JP); Yoshihiro Mori, Osaka (JP); Akihiko Tsuzumitani, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 137 days.

(21) Appl. No.: 10/656,153

(22) Filed: Sep. 8, 2003

(65) Prior Publication Data

US 2004/0056294 A1 Mar. 25, 2004

Related U.S. Application Data

(62) Division of application No. 10/196,229, filed on Jul. 17, 2002, now Pat. No. 6,642,564.

(30) Foreign Application Priority Data

Jul. 18, 2001 (JP) ........................................ 2001-218277

(51) Int. Cl.$^7$ .......................................... H01L 21/8242
(52) U.S. Cl. ........................ 438/253; 438/240; 438/396; 438/926
(58) Field of Search ................................ 438/240, 253, 438/396, 778, 926, FOR 220, FOR 430

(56) References Cited

U.S. PATENT DOCUMENTS 6,218,232 B1 * 4/2001 Heo ............................ 438/238
6,329,234 B1   12/2001 Ma et al.
6,376,304 B1    4/2002 Matsuoka et al.
6,399,974 B1    6/2002 Ohtsuki
6,404,414 B2 *  6/2002 Ishii ............................ 345/90
6,440,845 B1    8/2002 Jou et al.
6,441,419 B1    8/2002 Johnson et al.
2001/0017385 A1 * 8/2001 Yamamoto .................. 257/306

FOREIGN PATENT DOCUMENTS

| JP | 05-326551   | 12/1993 |
| JP | 08-008349   | 1/1996  |
| JP | 08-222709   | 8/1996  |
| JP | 10-256505   | 9/1998  |
| JP | 2001-244435 | 9/2001  |

* cited by examiner

Primary Examiner—George Fourson
Assistant Examiner—Joannie Adelle Garcia
(74) Attorney, Agent, or Firm—McDermott Will & Emery LLP

(57) ABSTRACT

In a memory cell of a DRAM, that is, a semiconductor memory, a bit line connected to a bit line plug and a local interconnect are provided on a first interlayer insulating film. A connection conductor film of TiAlN is provided on the top and side faces of an upper barrier metal and side faces of a Pt film and a BST film. No contact is formed above the Pt film used for forming an upper electrode, and the upper electrode is connected to an upper interconnect (namely, a Cu interconnect) through the connection conductor film, a dummy lower electrode, a dummy cell plug and the local interconnect. Since the Pt film is not exposed to a reducing atmosphere, the characteristic degradation of a capacitor insulating film can be prevented.

6 Claims, 9 Drawing Sheets

SEMICONDUCTOR MEMORY AND METHOD FOR FABRICATING THE SAME

This application is a divisional of application Ser. No. 10/196,229 filed Jul. 17, 2002, now U.S. Pat. No. 6,642,564.

BACKGROUND OF THE INVENTION

The present invention relates to a semiconductor memory and a method for fabricating the same, and more particularly, it relates to a memory cell structure of a semiconductor memory using a high-κ film or a ferroelectric film.

Recently, for multimedia equipment required to have a large memory capacity and a high data transfer rate, embedded-DRAM processes for combining DRAMs with a high performance logic circuit has been practically employed.

In conventional DRAM process, however, since it is necessary to perform high temperature annealing for forming a capacitor insulating film of a capacitor working as a memory capacitor, the impurity concentration profile of impurity diffusion layers of a transistor included in a high performance logic circuit can be disadvantageously degraded through this high temperature annealing. Also, in process for merely a memory such as a DRAM or a FeRAM, high temperature annealing is preferably avoided for reducing the size of a memory cell transistor.

Therefore, it is indispensable to develop a MIM (Metal-Insulator-Metal) capacitor using, as a capacitor insulating film of a memory capacitor, a high-κ film that can be formed at a low temperature and can provide a fine memory cell. An example of the high-κ film is a dielectric film having a perovskite structure such as a BST ((BaSr)TiO$_3$) film. On the other hand, as a material for a metal electrode of the MIM capacitor, Pt with high oxidation resistance is generally regarded as a promising material. Also, dielectric films with the perovskite structure, such as a SBT (SrBi$_2$Ta$_2$O$_9$) film and a BTO (Bi$_4$Ti$_3$O$_{12}$) film, are well known as ferroelectric films.

The conventional MIM capacitor serving as a memory capacitor has, however, the following problems:

When a contact hole is formed to reach a Pt electrode (upper electrode) provided on a capacitor insulating high-κ film film, a reducing atmosphere and the like employed in forming a contact plug may harmfully affect the characteristic of the capacitor. In general, most of dielectric films are oxides, and hence, oxygen included in such a dielectric film may be lost due to the reducing atmosphere. In particular, when the capacitor insulating film is a high-κ film or a ferroelectric film, there is high possibility of the oxygen loss. Particularly in a dielectric film with the perovskite structure, the characteristic can be largely degraded due to the oxygen loss.

Furthermore, in fabrication of devices such as a DRAM that conventionally do not use a Pt electrode, it is difficult to use the existing facilities for, for example, forming a contact reaching a Pt electrode that is newly used, and hence, such a procedure need to be performed by using dedicated facilities. This is for the following reason: For example, in forming a contact hole connected to a Pt electrode through an interlayer insulating film, Pt is sputtered when the Pt electrode is exposed, and hence, Pt is adhered onto the walls and members within a chamber. If this chamber is used for another process without any treatment, the Pt enters an active region or the like of a transistor, which can harmfully affect the operation of the transistor.

SUMMARY OF THE INVENTION

An object of the invention is providing a semiconductor memory including a MIM capacitor with a good characteristic and a method for fabricating the same by forming an interconnect layer connected not directly but indirectly to an upper electrode made from Pt or the like formed on a capacitor insulating film.

Another object of the invention is providing a semiconductor memory and a method for fabricating the same in which the fabrication cost can be lowered because no dedicated facilities are necessary.

The semiconductor memory of this invention includes a memory capacitor that is formed on an insulating layer over a semiconductor substrate and includes a lower electrode, an upper electrode and a capacitor insulating film disposed between the lower electrode and the upper electrode; a capacitor insulating film extension and an upper electrode extension extending respectively from the capacitor insulating film and the upper electrode of the memory capacitor; a dummy conducting member including a portion below the upper electrode extension and the capacitor insulating film extension; a conducting member in contact with side faces of the upper electrode extension and the capacitor insulating film extension and connected to the dummy conducting member; and an upper interconnect electrically connected to the dummy conducting member.

Thus, there is no need to directly connect the upper interconnect to the upper electrode. Therefore, even when the upper electrode is made from Pt or the like, characteristic degradation derived from exposure of the capacitor insulating film to a reducing atmosphere can be prevented.

When the conducting member covers entire peripheral side faces of the upper electrode extension and the capacitor insulating film extension, more definite electrical connection can be obtained.

The capacitor insulating film may be a high-κ film or a ferroelectric film.

When the semiconductor memory further includes a bit line formed below the memory capacitor with the insulating layer sandwiched therebetween; a local interconnect formed by using the same conductor film as that used for forming the bit line; and a conducting plug for connecting the dummy lower electrode and the local interconnect to each other through the insulating layer, a structure suitable to a memory of a capacitor over bit-line can be obtained by utilizing the conductor film used for forming the bit line.

The semiconductor memory can further include an isolation insulating film provided on the semiconductor substrate below the insulating layer; a memory cell transistor that is provided on the semiconductor substrate in a region surrounded with the isolation insulating film and includes a gate electrode and impurity diffusion layers formed in the semiconductor substrate on both sides of the gate electrode; a local interconnect provided on the isolation insulating film and formed by using the same conductor film as that used for forming the gate electrode; and a conducting plug connected to the local interconnect through the interlayer insulating film. Thus, a structure applicable to a memory of both a capacitor over bit-line and a capacitor under bit-line can be obtained by utilizing the conductor film (such as a polysilicon film) used for forming the gate electrode.

The semiconductor memory can further include a memory cell transistor that is provided on the semiconductor substrate and includes a gate electrode and impurity diffusion layers formed in the semiconductor substrate on both sides of the gate electrode; a local interconnect made from another impurity diffusion layer spaced from the impurity diffusion layers in the semiconductor substrate; and a conducting plug connected to the local interconnect through the insulating layer. Thus, a structure applicable to a memory of both a capacitor over bit-line and a capacitor under bit-line be obtained by utilizing the process for forming the source and drain regions.

When the dummy conducting member is provided in a region surrounded, on a side face thereof, with at least the insulating layer and the conducting member is in contact with the upper electrode extension and the dummy conducting member, the upper electrode extension and the upper interconnect can be electrically connected to each other without providing the dummy lower electrode. Therefore, the area of the semiconductor memory can be reduced.

In the semiconductor memory, the dummy conducting member can be a local interconnect, and the upper interconnect can be in contact with the local interconnect.

In the semiconductor memory, the dummy conducting member can be a dummy plug, and the conducting member can be in contact with at least a part of a top face of the dummy plug.

In the semiconductor memory, the conducting member can be a conducting sidewall that is provided over side faces of the upper electrode extension and the capacitor insulating film extension and is in contact with at least a part of a top face of the dummy conducting member.

When the lower electrode, the capacitor insulating film and the upper electrode of the memory capacitor are in the shape of a cylinder, memory cells can be arranged at comparatively high density in the semiconductor memory.

The method of this invention for fabricating a semiconductor memory containing a memory capacitor including a lower electrode, an upper electrode and a capacitor insulating film disposed between the lower electrode and the upper electrode; a dummy conducting member electrically connected to the upper electrode; and an upper interconnect electrically connected to the dummy conducting member, includes the steps of (a) forming the lower electrode by forming a first conductor film over an insulating layer on a semiconductor substrate and patterning the first conductor film; (b) forming a dielectric film covering the lower electrode; (c) forming a second conductor film covering the dielectric film; (d) forming, on the second conductor film, an etching mask covering a part of the lower electrode; (e) patterning the second conductor film and the dielectric film, whereby forming the capacitor insulating film and a capacitor insulating film extension from the dielectric film and the upper electrode and an upper electrode extension from the second conductor film; and (f) depositing a third conductor film on the substrate after the step (e) and patterning the third conductor film, whereby forming a conducting member in contact with side faces of the upper electrode extension and the capacitor insulating film extension and electrically connected to the dummy conducting member.

In this method, the upper electrode and the dummy conducting member are electrically connected to each other through the conducting member in the step (f). Therefore, there is no need to form a contact above the upper electrode, and hence, the characteristic degradation of the capacitor insulating film can be prevented. Also, the number of photolithography procedures and the like is not increased between the steps (a) and (f) as compared with that in conventional technique.

In the method for fabricating a semiconductor memory, the lower electrode and a dummy film spaced away from the lower electrode can be formed by patterning the first conductor film in the step (a), a dummy lower electrode can be formed as at least a part of the dummy conducting member by patterning the dummy film in any step between the step (b) and the step (e), and the conducting member formed in the step (f) can be in contact with side faces of the upper electrode extension, the capacitor insulating film extension and the dummy lower electrode and covers at least a part of a portion above the upper electrode extension. Thus, the upper electrode and the upper interconnect can be electrically connected to each other through the conducting member and the dummy lower electrode.

The method for fabricating a semiconductor memory may further include, before the step (a), a step of forming at least a part of the dummy conducting member in a region surrounded, on a side face thereof, with the insulating layer, and the conducting member formed in the step (f) can be in contact with at least a part of a top face of the dummy conducting member. Thus, the upper electrode and the upper interconnect can be electrically connected to each other through the conducting member and the dummy conducting member.

In the method for fabricating a semiconductor memory, the conducting member formed in the step (f) can be a conductor film that is in contact with the side faces of the upper electrode extension and the capacitor insulating film extension and covers at least a part of a portion above the upper electrode extension.

In the method for fabricating a semiconductor memory, the conducting member formed in the step (f) can be a conducting sidewall in contact with the side faces of the upper electrode extension and the capacitor insulating film extension.

In the method for fabricating a semiconductor memory, the dielectric film may be a high-κ film or a ferroelectric film.

DETAILED DESCRIPTION OF THE INVENTION

Embodiment 1

In this embodiment, application of this invention to a DRAM memory cell structure in which bit lines are provided below a memory capacitor, namely, the so-called capacitor over bit-line, will be described.

Figure 1A:
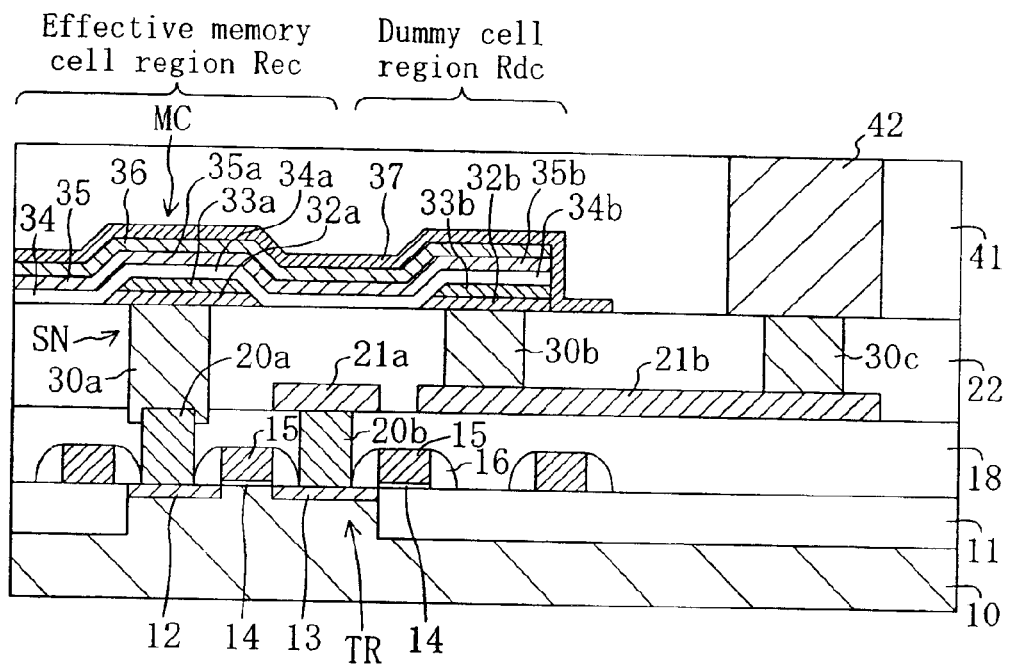
FIGS. 1A and 1B are respectively a cross-sectional view for partly showing a memory part and a plan view for showing an upper electrode and a connection conductor film included in a semiconductor memory according to Embodiment 1 of the invention.
Figure 1B:
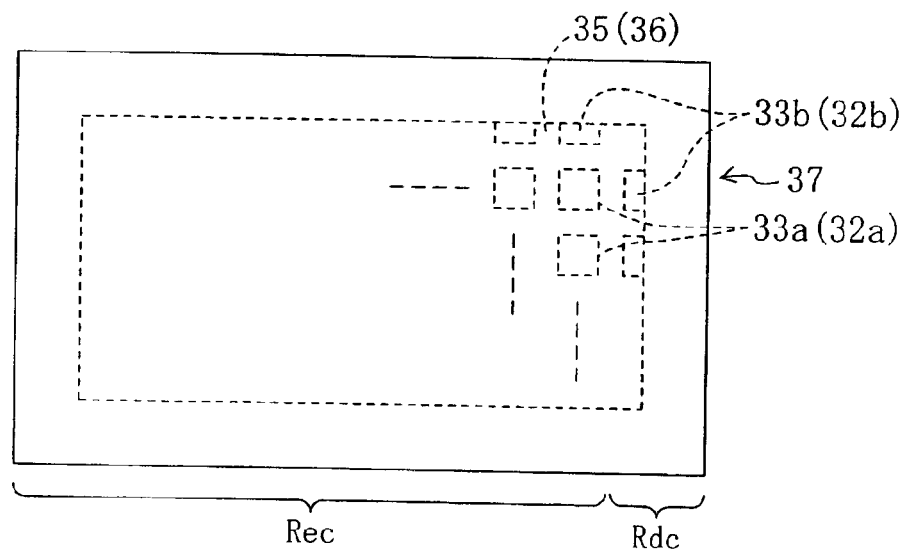
Figure 2A:
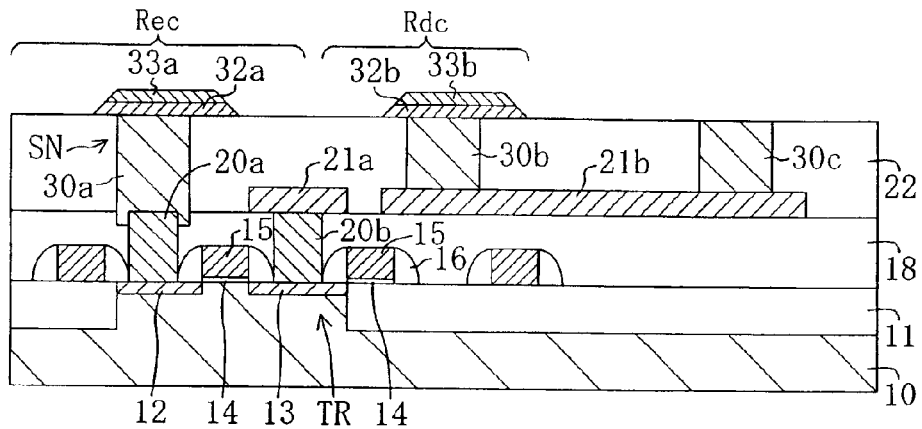
FIGS. 2A, 2B and 2C are cross-sectional views for showing procedures in a method for fabricating a semiconductor memory according to Embodiment 1 of the invention.
Figure 2B:
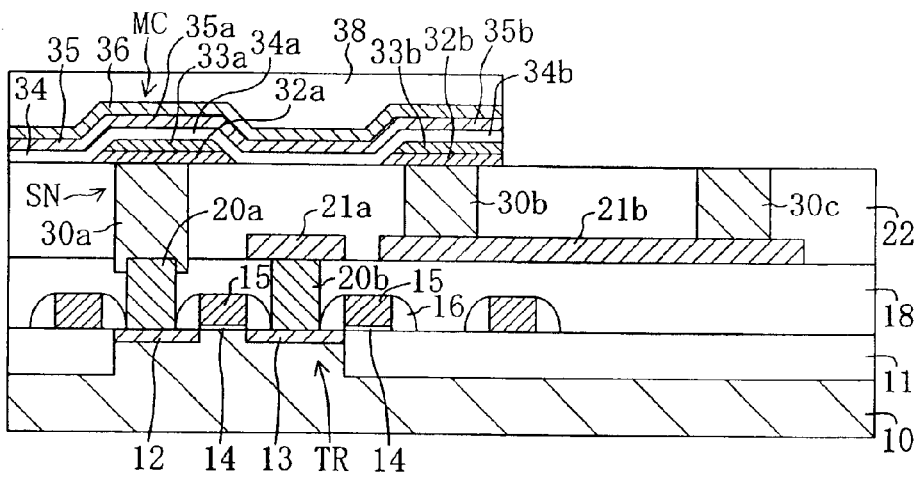
Figure 2C:
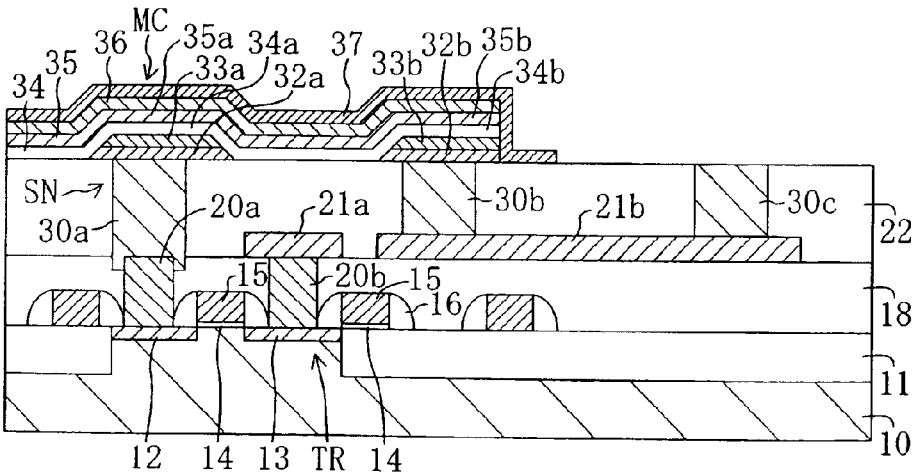

FIGS. 1A and 1B are respectively a cross-sectional view for partly showing the structure of a memory part and a plan view for showing an upper electrode and a connection conductor film included in a semiconductor memory according to Embodiment 1 of the invention. FIGS. 2A through 2C are cross-sectional views for showing procedures in a method for fabricating the semiconductor memory of this embodiment. Now, the structure of and the fabrication method for the semiconductor memory of this embodiment will be successively described. In each drawing referred to in this embodiment, the structure of the memory part alone is shown, but the semiconductor memory of this embodiment is an embedded device in which a logic circuit element is formed in a logic circuit part not shown. However, the structure of the logic circuit element is not shown in the drawings because it is not directly concerned with the essence of the invention.

Structure of Memory Cell

As shown in FIG. 1A, in a memory cell of a DRAM, that is, the semiconductor memory of this embodiment, an isolation insulating film 11 surrounding an active region and a source region 12 and a drain region 13 formed by introducing an n-type impurity are formed with spaces therebetween in surface portions of a p-type Si substrate 10. A region of the p-type Si substrate 10 sandwiched between the source region 12 and the drain region 13 functions as a channel region. Also, on the active region of the Si substrate 10, a gate insulating film 14 of silicon oxide is formed between the source region 12 and the drain region 13, a gate electrode 15 (corresponding to a part of a word line) of polysilicon is formed on the gate insulating film 14, and an insulating sidewall 16 of silicon oxide is formed on side faces of the gate electrode 15. The source region 12, the drain region 13, the channel region, the gate insulating film 14 and the gate electrode 15 together form a memory cell transistor TR. The gate electrodes 15 shown in the cross-sectional view of FIG. 1A include those not functioning as the gate of a memory cell transistor TR, but such gate electrodes 15 also function as the gates of memory cell transistors in cross-sections different from that of FIG. 1A. These gate electrodes 15 extend along a direction substantially perpendicular to the surface of the drawing so as to work as word lines of the DRAM.

Also, on the Si substrate 10, a first interlayer insulating film 18 of BPSG is provided so as to cover the isolation insulating film 11, the gate electrode 15 and the insulating sidewall 16. A lower memory cell plug 20a of polysilicon in contact with the source region 12 and a bit line plug 20b in contact with the drain region 13 are formed through the first interlayer insulating film 18. Furthermore, on the first interlayer insulating film 18, a bit line 21a of a W/Ti multilayer film connected to the bit line plug 20b and a local interconnect 21b made from the same W/Ti multilayer film as that used for the bit line 21a are formed. Also on the first interlayer insulating film 18, a second interlayer insulating film 22 of plasma TEOS is formed. An upper memory cell plug 30a in contact with the lower memory cell plug 20a, a dummy cell plug 30b in contact with the local interconnect 21b and an interconnect plug 30c in contact with the local interconnect 21b are formed through the second interlayer insulating film 22.

On the second interlayer insulating film 22, a lower barrier metal 32a of TiAlN, a lower electrode 33a of Pt formed thereon, a dummy lower barrier metal 32b of TiAlN and a dummy lower electrode 33b formed thereon are provided. Furthermore, a BST ((BaSr)TiO$_3$) film 34 covering the second interlayer insulating film 22, the lower electrode 33a and the dummy lower electrode 33b, a Pt film 35 covering the BST film 34, and an upper barrier metal 36 of TiAlN covering the Pt film 35 are formed.

A portion of the BST film 34 in contact with the lower electrode 33a corresponds to a capacitor insulating film 34a, and another portion of the BST film 34 in contact with the dummy lower electrode 33b corresponds to a capacitor insulating film extension 34b. Also, a portion of the Pt film 35 opposing the lower electrode 33a corresponds to an upper electrode 35a, and another portion of the Pt film 35 opposing the dummy lower electrode 33b corresponds to an upper electrode extension 35b. The lower barrier metal 32a and the lower electrode 33a together form a storage node SN of the DRAM memory cell. Also, the lower electrode 33a, the capacitor insulating film 34a and the upper electrode 35a together form a memory capacitor MC.

A connection conductor film 37 is formed over the top and side faces of the upper barrier metal 36, the side face of the Pt film 35, the side face of the BST film 34 and the top face of the second interlayer insulating film 22. The connection conductor film 37 covers the whole top face of the upper barrier metal 36 and entirely surrounds the upper barrier metal 36, the Pt film 35 and the BST film 34. In particular, in a dummy cell region Rdc, the connection conductor film 37 is formed on the side faces of the upper barrier metal 36, the upper electrode extension 35b, the capacitor insulating film extension 34b, the dummy lower electrode 33b and the dummy lower barrier metal 32b as shown in FIG. 1B. Owing to this structure, the connection conductor film 37 electrically connects the upper electrode extension 35b and the dummy lower electrode 33b to each other. The connection conductor film 37 need not always cover the whole top face of the upper barrier metal 36. However, when the connection conductor film 37 covers the whole top face of the upper barrier metal 36, invasion of a reducing atmosphere can be suppressed.

Furthermore, a third interlayer insulating film 41 of plasma TEOS is formed on the second interlayer insulating film 22 and the connection conductor film 37, and a Cu interconnect 42 in contact with the interconnect plug 30c is buried in the third interlayer insulating film 41.

Specifically, the structure shown in FIGS. 1A and 1B includes an effective memory cell region Rec where the memory capacitor MC, the storage node SN, the memory cell transistor TR and the like are formed, and the dummy region Rdc where the dummy lower electrode 33b, the capacitor insulating film extension 34b, the upper electrode extension 35b, the dummy cell plug 30b and the like are formed.

As a characteristic of this embodiment, there is no plug in contact with the upper electrode 35a or the upper electrode extension 35*b*, and the upper electrode 35*a* is connected to the upper interconnect (namely, the Cu interconnect 42) through the connection conductor film 37, the dummy lower electrode 33*b*, the dummy plug 30*b*, the interconnect plug 30*c* and the local interconnect 21*b*.

As shown in FIG. 1B, the Pt film 35 used for forming the upper electrode 35*a* and the upper barrier metal 36 is shared between a large number of memory cells, and a large number of lower electrodes 33*a*, lower barrier metals 32*a* and the dummy lower electrode 33*b* and the dummy lower barrier metal 32*b* are provided below the Pt film 35. The dummy lower electrode 33*b* and the dummy lower barrier metal 32*b* are provided in plural in number below the Pt film 35, but the upper electrode 35*a*, the dummy lower electrode 33*b* and the dummy lower barrier metal 32*b* can be electrically connected to each other as far as at least one dummy lower electrode is provided below any portion of the Pt film 35.

According to this embodiment, since there is no plug above the Pt film 35 used for forming the upper electrode and the upper barrier metal 36, there is no need to form a contact hole for filling a plug in the third interlayer insulating film 41 and the connection conductor film 37. Accordingly, the Pt film used for forming the upper electrode is never exposed in dry etching (plasma etching) for forming a contact hole reaching the upper electrode differently from the conventional technique. In other words, when an exposed Pt film is subjected to a reducing atmosphere, oxygen loss can be caused in a capacitor insulating film (in particular, a high-κ film) of BST or the like. Even when an upper barrier metal of TiAlN is formed on the Pt film as in this embodiment, the upper barrier metal has a small thickness and a contact hole probably reaches the upper electrode of Pt because over-etching is generally performed in etching for forming the contact hole. Therefore, the upper barrier metal cannot be expected to prevent the oxygen loss in the capacitor insulating film. In contrast, according to this embodiment, since no contact hole is formed above the Pt film 35, the oxygen loss in the capacitor insulating film 34*a* derived from exposure of the Pt film to a reducing atmosphere can be definitely avoided.

Furthermore, since the Pt film 35 is never exposed for forming a contact hole in the interlayer insulating film, the etching for forming the contact holes can be performed in the same apparatus (such as a chamber) as that used in process for forming a logic circuit element. The formation of the lower electrode 33*a*, the dummy lower electrode 33*b* and the upper electrode 35*a* of Pt is performed in dedicated facilities for Pt film formation, and hence, it does not essentially contaminate the apparatus for forming the logic circuit element.

Fabrication method for memory cell

Next, the method for fabricating the memory cell of the semiconductor memory of this embodiment will be described with reference to FIGS. 2A through 2C.

In the procedure shown in FIG. 2A, the following processing is carried out: First, an isolation insulating film 11 surrounding an active region is formed in a p-type Si substrate 10, and a memory cell transistor TR composed of a source region 12, a drain region 13, a gate insulating film 14, a gate electrode 15 and an insulating sidewall 16 is formed on the active region. This memory cell transistor TR is formed through known procedures by using known techniques such as thermal oxidation, polysilicon film formation, patterning and ion injection.

Next, after depositing a BPSG film on the memory cell transistor TR, the BPSG film is subjected to annealing and planarization by CMP (chemical mechanical polishing) so as to form a first interlayer insulating film 18. Then, contact holes reaching the source region 12 and the drain region 13 are formed through the first interlayer insulating film 18. Subsequently, an n-type polysilicon film is formed within the contact holes and on the first interlayer insulating film 18, and the polysilicon film is planarized by the CMP so as to fill the contact holes with the polysilicon film. Thus, a lower memory cell plug 20*a* and a bit line plug 20*b* are formed.

Next, after depositing a W/Ti multilayer film on the first interlayer insulating film 18, the W/Ti multilayer film is patterned by etching, so as to form a bit line 21*a* connected to the bit line plug 20*b* and a local interconnect 21*b* that is not connected to any other member but isolated at this stage. In patterning the W film, the etching end point of the W film is determined by detecting time when the surface of the Ti film is exposed, and in patterning the Ti film, the etching is performed under conditions for attaining a high etching selectivity against the first memory cell plug 20*a* of polysilicon.

Then, after depositing a plasma TEOS film on the substrate, the plasma TEOS film is subjected to the planarization by the CMP (chemical mechanical polishing) so as to form a second interlayer insulating film 22. Furthermore, contact holes reaching the lower memory cell plug 20*a* and two portions of the local interconnect 21*b* are formed through the second interlayer insulating film 22. Thereafter, a W film is formed within the contact holes and then planarized by the CMP, so as to fill the contact holes with the W film. Thus, an upper memory cell plug 30*a* connected to the lower memory cell plug 20*a*, and a dummy cell plug 30*b* and an interconnect plug 30*c* connected to the two portions of the local interconnect 21*b* are formed.

Subsequently, a TiAlN film with a thickness of approximately 6 nm and a Pt film with a thickness of approximately 50 nm are successively deposited on the second interlayer insulating film 22. The TiAlN film and the Pt film are patterned, so as to form, on the second interlayer insulating film 22, a lower barrier metal 32*a* connected to the upper memory cell plug 30*a* and a lower electrode 33*a* of Pt formed thereon, and a dummy lower barrier metal 32*b* connected to the dummy cell plug 30*b* and a dummy lower electrode 33*b* formed thereon. In patterning the Pt film, the etching is performed under conditions for attaining high etching selectivity against the underlying TiAlN film, and in patterning the TiAlN film, the etching is performed under conditions for attaining etching selectivity sufficiently high for avoiding etching the underlying upper memory cell plug 30*a* of W.

Next, in the procedure shown in FIG. 2B, a BST ((BaSr) TiO$_3$) film with a thickness of approximately 30 nm, a Pt film with a thickness of approximately 30 nm, a TiAlN film with a thickness of approximately 6 nm and an NSG (nondoped silicated glass) film are successively deposited so as to cover the second interlayer insulating film 22, the lower electrode 33*a* and the dummy lower electrode 33*b*. The NSG film is patterned into a hard mask 38, and dry etching is performed by using the hard mask 38. Thus, the TiAlN film, the Pt film and the BST film are successively patterned, so as to form an upper barrier metal 36 covering the effective memory cell region Rec and the dummy cell region Rdc, a Pt film 35 including an upper electrode 35*a* and an upper electrode extension 35*b*, and a BST film 34 including a capacitor insulating film 34*a* and a capacitor insulating film extension 34*b*. Thereafter, the hard mask 38 is selectively removed by using, for example, a diluted hydrofluoric acid solution.

Next, in the procedure shown in FIG. 2C, a TiAlN film with a thickness of, for example, approximately 30 nm is formed on the substrate, and the TiAlN film is patterned by using a resist mask into a connection conductor film 37. At this point, the connection conductor film 37 covers the top face of the upper barrier metal 36 in the effective memory cell region Rec and the dummy cell region Rdc on the substrate, covers the side faces of the upper barrier metal 36, the Pt film 35, the BST film 34, the dummy lower electrode 33b and the dummy lower barrier metal 32b on the cross-sections in the dummy cell region Rdc, and also covers a part of the second interlayer insulating film 22.

Thereafter, a third interlayer insulating film 41 is deposited and planarized, a trench in contact with the interconnect plug 30c is formed through the third interlayer insulating film 41 and a Cu interconnect 42 is buried in the trench (by the damascene method), resulting in obtaining the memory cell having the cross-sectional structure shown in FIG. 1A.

In the fabrication method of this embodiment, a procedure for forming a contact above the Pt film 35 (and the upper barrier metal 36) through the third interlayer insulating film 41 and the connection conductor film 37 can be avoided. In other words, in forming a Cu interconnect such as in forming a trench through the third interlayer insulating film 41, annealing performed in a reducing atmosphere is generally employed. Accordingly, if a contact hole is formed above the upper barrier metal 36, ammonia or the like passes through the thin upper barrier metal 36 to reach the Pt film 35, or if the Pt film 35 is exposed as a result of over-etching or the like, ammonia or the like directly comes in contact with the Pt film 35. Thus, ammonia or the like can reach the BST film 34 through the Pt film 35. In such a case, oxygen included in the BST film 34 may be lost so as to cause the oxygen loss, resulting in degrading the characteristic of the capacitor insulating film 34a. In contrast, when the procedure for forming a contact hole above the Pt film 35 is avoided as in this embodiment, the characteristic of the capacitor insulating film 34a can be definitely prevented from degrading due to such a cause. In addition, since the top face and the side face of the upper barrier metal 36, the side face of the upper electrode extension 35b, the side face of the dummy lower electrode 33b and the side face of the dummy lower barrier metal 32b can be covered with the connection conductor film 37 formed as one layer, a definite connection structure can be obtained. Also, since the whole top face of the upper barrier metal 36 is covered with the connection conductor film 37, invasion of a reducing atmosphere can be suppressed.

The procedure for forming the Cu interconnect 42 corresponds to a conventional procedure for forming a plug in contact with an upper electrode, and the local interconnect 21b and the interconnect contact 30c can be formed by utilizing the procedures for forming the memory cell.

Although the upper electrode 35a and the lower electrode 33a are made from Pt and the upper barrier metal 36 and the connection conductor film 37 are made from TiAlN in this embodiment, these members may be made from other conducting materials with oxidation resistance. Also, although the capacitor insulating film 34a is made from BST, another high-κ film may be used instead. In particular, in the case where a dielectric film having a perovskite structure represented by $ABO_3$ is used, oxygen atoms can be easily lost through reduction, and hence, the present invention can be very effective in such a case.

Furthermore, it goes without saying that the present invention is applicable not only to an embedded device as in this embodiment but also to any semiconductor memory including a capacitor using a metal electrode, such as a generally used DRAM or FeRAM.

Embodiment 2

Figure 3:
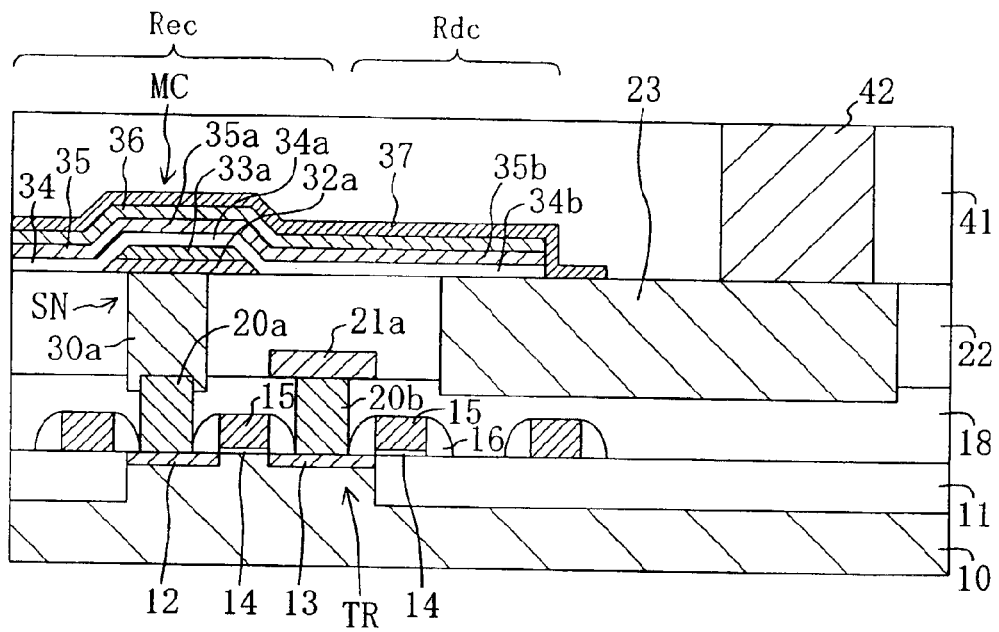
FIG. 3 is a cross-sectional view for partly showing a memory part included in a semiconductor memory according to Embodiment 2 of the invention.

FIG. 3 is a cross-sectional view for partly showing the structure of a memory part of a semiconductor memory according to Embodiment 2.

As shown in FIG. 3, the structure of the memory part of this embodiment is different from that of Embodiment 1 in that the local interconnect 21b of the W/Ti film, the dummy cell plug 30b, the dummy lower barrier metal 32b and the dummy lower electrode 33b of Embodiment 1 are not formed and that a local interconnect 23 of W is filled within a trench formed in the second interlayer insulating film 22. The local interconnect 23 is formed simultaneously with the upper memory cell plug 30a. The other members of this semiconductor memory are the same as those shown in FIG. 1A, and like reference numerals are used to refer to like members shown in FIG. 1A.

In this embodiment, the upper electrode 35a and the Cu interconnect 42 are electrically connected to each other through the local interconnect 23 of W and the connection conductor film 37. Also in this embodiment, there is no need to form a contact hole above the Pt film 35 used for forming the upper electrode 35a (and the upper barrier metal 36) through the third interlayer insulating film 41. Accordingly, the characteristic degradation of the capacitor insulating film 34a can be prevented and dedicated facilities for the memory cell formation are not necessary in this embodiment similarly to Embodiment 1.

In addition, since there is no need to form a dummy lower electrode in this embodiment, the area occupied by the memory part can be advantageously reduced as compared with that in Embodiment 1.

Embodiment 3

Figure 4:
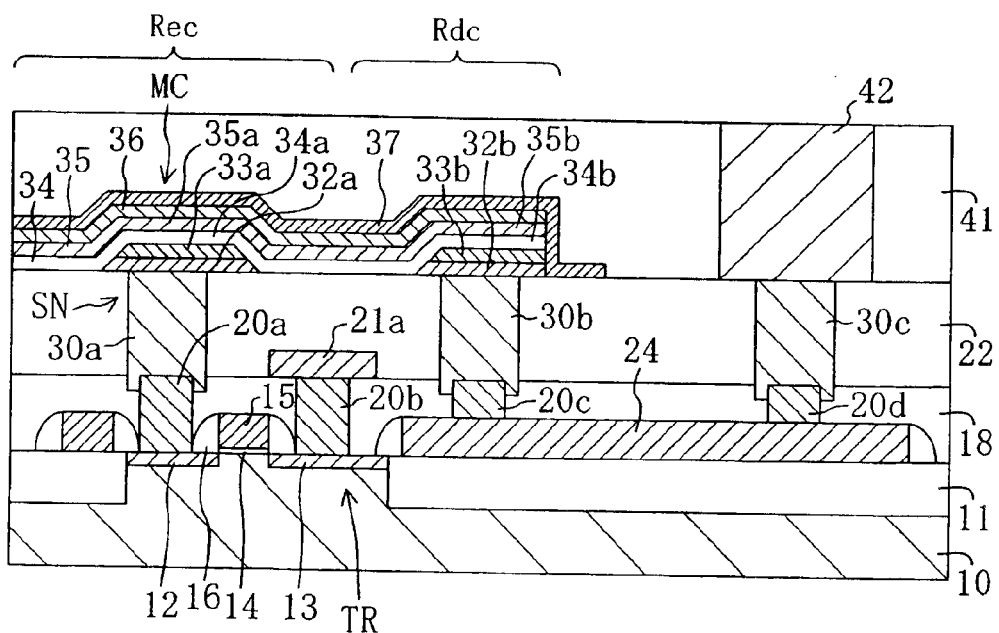
FIG. 4 is a cross-sectional view for partly showing a memory part included in a semiconductor memory according to Embodiment 3 of the invention.

FIG. 4 is a cross-sectional view for partly showing the structure of a memory part of a semiconductor memory according to Embodiment 3 of the invention.

As shown in FIG. 4, the structure of the memory part of this embodiment is different from that of Embodiment 1 in that the local interconnect 21b of the W/Ti film of Embodiment 1 is replaced with a local interconnect 24 of polysilicon formed on the isolation insulating film 11, and that a lower dummy cell plug 20c in contact with the local interconnect 24 and a lower interconnect plug 20d in contact with the local interconnect 24 are formed through the first interlayer insulating film 18. In addition, the dummy cell plug 30b is connected to the lower dummy cell plug 20c and the interconnect plug 30c is connected to the lower interconnect plug 20d in this embodiment. The local interconnect 24 is formed simultaneously with the gate electrode 15. The other members are the same as those shown in FIG. 1A, and like reference numerals are used to refer to like members shown in FIG. 1A.

In this embodiment, the upper electrode 35a and the Cu interconnect 42 are electrically connected to each other through the connection conductor film 37, the dummy lower electrode 33b, the dummy lower barrier metal 32b, the dummy cell plug 30b, the lower dummy cell plug 20c, the local interconnect 24, the lower interconnect plug 20d and the interconnect plug 30c. Also in this embodiment, there is no need to form a contact hole above the Pt film 35 used for forming the upper electrode 35a (and the upper barrier metal 36) through the third interlayer insulating film 41. Accordingly, the characteristic degradation of the capacitor insulating film 34a can be prevented and dedicated facilities for the memory cell formation are not necessary in this embodiment similarly to Embodiment 1.

Figure 5:
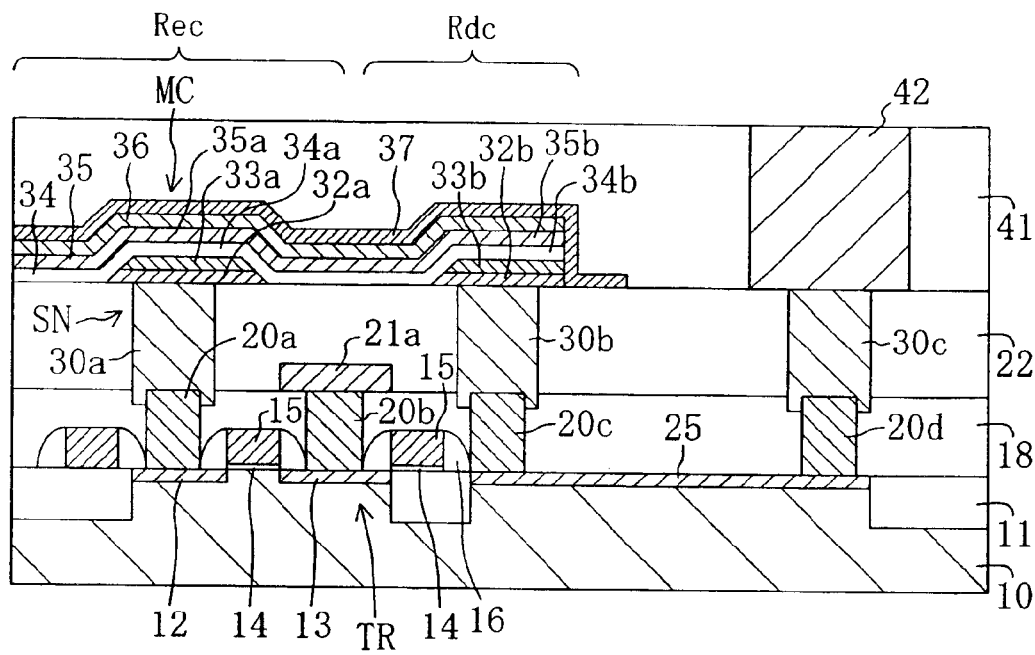
FIG. 5 is a cross-sectional view for partly showing a memory part included in a semiconductor memory according to Embodiment 4 of the invention.

Embodiment 4:

FIG. 5 is a cross-sectional view for partly showing the structure of a memory part of a semiconductor memory according to Embodiment 4 of the invention.

As shown in FIG. 5, the structure of the memory part of this embodiment is different from that of Embodiment 1 in that the local interconnect 21b of the W/Ti film of Embodiment 1 is replaced with a local interconnect 25 made from an impurity diffusion layer formed in the Si substrate 10, and that a lower dummy cell plug 20c in contact with the local interconnect 25 and a lower interconnect plug 20d in contact with the local interconnect 25 are formed through the first interlayer insulating film 18. The dummy cell plug 30b is connected to the lower dummy cell plug 20c and the interconnect plug 30c is connected to the lower interconnect plug 20d in this embodiment. The local interconnect 25 is formed simultaneously with the source and drain regions 12 and 13. The other members are the same as those shown in FIG. 1A, and like reference numerals are used to refer to like members shown in FIG. 1A.

In this embodiment, the upper electrode 35a and the Cu interconnect 42 are electrically connected to each other through the connection conductor film 37, the dummy lower electrode 33b, the dummy lower barrier metal 32b, the dummy cell plug 30b, the lower dummy cell plug 20c, the local interconnect 25, the lower interconnect plug 20d and the interconnect plug 30c. Also in this embodiment, there is no need to form a contact hole above the Pt film 35 used for forming the upper electrode 35a (and the upper barrier metal 36) through the third interlayer insulating film 41. Accordingly, the characteristic degradation of the capacitor insulating film 34a can be prevented and dedicated facilities for the memory cell formation are not necessary in this embodiment similarly to Embodiment 1.

Embodiment 5

Figure 6:
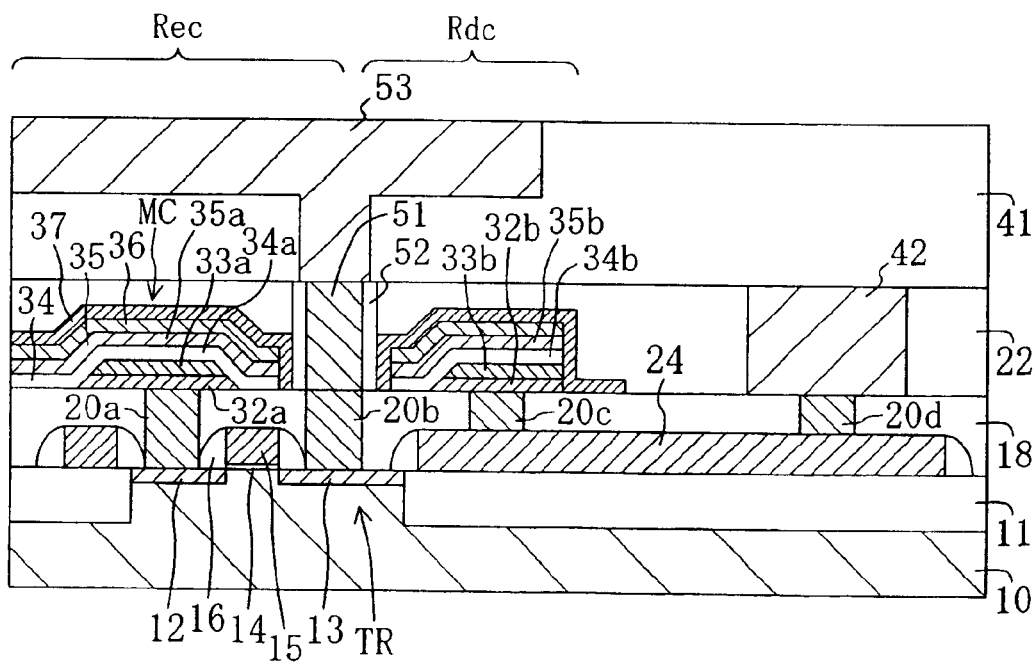
FIG. 6 is a cross-sectional view for partly showing a memory part included in a semiconductor memory according to Embodiment 5 of the invention.
Figure 7A:
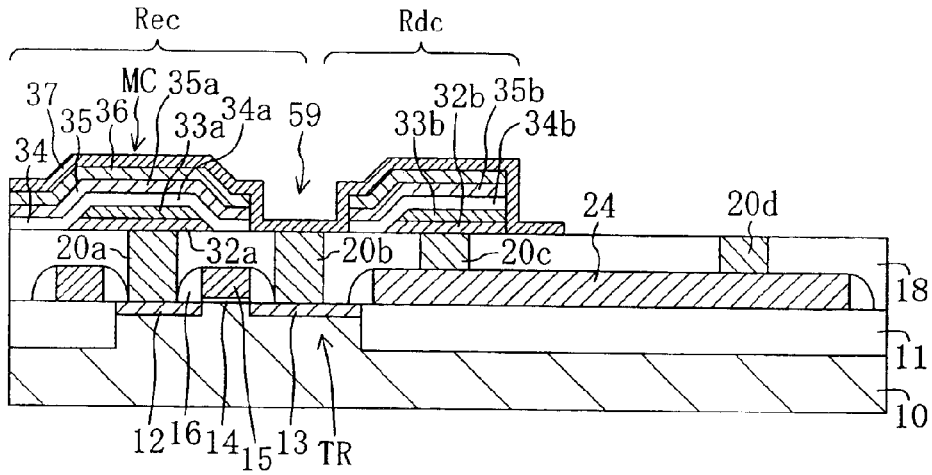
FIGS. 7A, 7B and 7C are cross-sectional views for showing procedures in a method for fabricating a semiconductor memory according to Embodiment 5 of the invention.
Figure 7B:
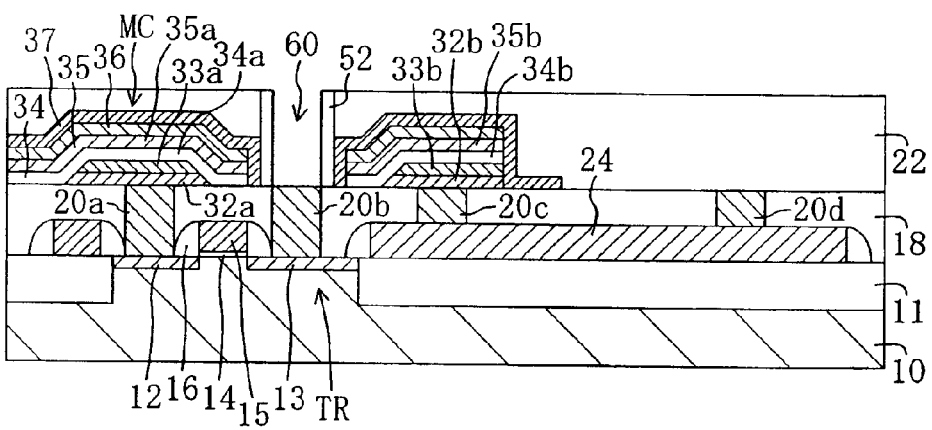
Figure 7C:
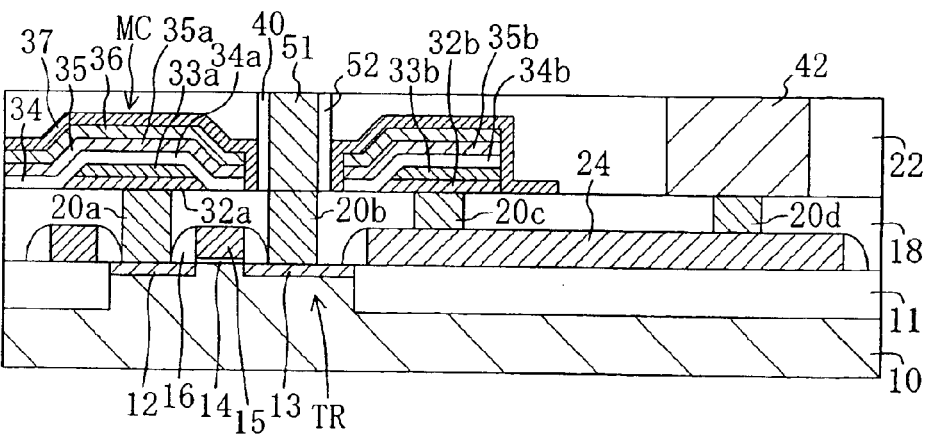

In each of Embodiments 1 through 4 described above, the present invention is applied to a DRAM memory cell structure of a capacitor over bit-line. In this embodiment, the invention is applied to a DRAM memory cell structure of a capacitor under bit-line in which bit lines are disposed above a memory capacitor. FIG. 6 is a cross-sectional view for partly showing the structure of a memory part of a semiconductor memory according to Embodiment 5, and FIGS. 7A through 7C are cross-sectional views for showing procedures in a method for fabricating a semiconductor memory according to Embodiment 5. The structure of and the fabrication method for the semiconductor memory of this embodiment will now be successively described. Although the structure of the memory part alone is shown in each drawing referred to in this embodiment, the semiconductor memory of this embodiment is an embedded device in which a logic circuit element is provided in a logic circuit part not shown as in Embodiment 1. However, the structure of the logic circuit part is not shown because it is not directly concerned with the essence of the invention.

As shown in FIG. 6, the memory part of this embodiment includes, similarly to that of Embodiment 3, a local interconnect 24 of polysilicon formed on an isolation insulating film 11 instead of the local interconnect 21b of the W/Ti film of Embodiment 1, and a lower dummy cell plug 20c in contact with the local interconnect 24 and a lower interconnect plug 20d in contact with the local interconnect 24 are formed through a first interlayer insulating film 18.

Also, in this embodiment, a memory capacitor MC and a dummy cell are provided on the first interlayer insulating film 18, a dummy lower electrode 33b (and the dummy lower barrier metal 32b) is directly connected to the lower dummy cell plug 20c and a first Cu interconnect 42 is directly connected to the lower interconnect plug 20d. The local interconnect 24 is formed from the same polysilicon film as that used for forming a gate electrode 15.

Furthermore, an upper bit line plug 51 in contact with the bit line plug 20b through a second interlayer insulating film 22; an insulating sidewall 52 covering the side face of the upper bit line plug 51; a connection conductor film 37 of TiAlN covering the top face and the side face of an upper barrier metal 36 and the side faces of a Pt film 35 and a BST film 34; and a bit line 53 of a Cu film buried in a third interlayer insulating film 41 are provided on a bit line plug 20b. In other words, this semiconductor memory has the DRAM memory cell structure of the capacitor under bit-line in which the bit lines are provided above the memory capacitor MC. The connection conductor film 37 is disposed between the side faces of the upper barrier metal 36, the Pt film 35 and the BST film 34 and the insulating sidewall 52.

The other members shown in FIG. 6 are the same as those shown in FIG. 1A, and like reference numerals used in FIG. 1A are used to refer to these members.

In this embodiment, the upper electrode 35a and the first Cu interconnect 42 are electrically connected to each other through the connection conductor film 37, the dummy lower electrode 33b, the dummy lower barrier metal 32b, the dummy cell plug 30b, the lower dummy cell plug 20c, the local interconnect 24 and the lower interconnect plug 20d. Also in this embodiment, there is no need to form a contact hole above the Pt film 35 used for forming the upper electrode 35a (and the upper barrier metal 36) through the third interlayer insulating film 41. Accordingly, in the structure of the capacitor under bit-line, the characteristic degradation of the capacitor insulating film 34a can be prevented and no dedicated facilities for the memory cell formation are necessary similarly to Embodiment 1.

Next, the procedures for fabricating the semiconductor memory of this embodiment will be described with reference to FIGS. 7A through 7C.

In the procedure shown in FIG. 7A, the following processing is performed: First, an isolation insulating film 11 surrounding an active region is formed in a p-type Si substrate 10, and a memory cell transistor TR composed of a source region 12, a drain region 13, a gate insulating film 14, a gate electrode 15 and an insulating sidewall 16 is formed on the active region. This memory cell transistor TR is formed through known procedures using known techniques such as the thermal oxidation, the polysilicon film formation, the patterning and the ion injection. At this point, a local interconnect 24 of polysilicon is formed on the isolation insulating film 11 simultaneously with the gate electrode 15.

Next, after depositing a BPSG film on the substrate having the memory cell transistor TR, the BPSG film is subjected to the annealing and the planarization by the CMP (chemical mechanical polishing), so as to form a first interlayer insulating film 18. Then, contact holes reaching the source region 12, the drain region 13 and two portions of the local interconnect 24 are formed through the first interlayer insulating film 18. Thereafter, an n-type polysilicon film is formed within the contact holes and on the first interlayer insulating film 18 and the polysilicon film is planarized by the CMP, so as to fill the contact holes with the polysilicon film. Thus, a lower memory cell plug 20a, a bit line plug 20b, a lower dummy cell plug 20c and a lower interconnect plug 20d are formed.

Then, a TiAlN film with a thickness of approximately 6 nm and a Pt film with a thickness of approximately 50 nm are successively deposited on the first interlayer insulating film 18. The TiAlN film and the Pt film are patterned, so as to form, on the first interlayer insulating film 18, a lower barrier metal 32a connected to the lower memory cell plug 20a and a lower electrode 33a of Pt formed thereon, and a dummy lower barrier metal 32b connected to the lower dummy cell plug 20b and a dummy lower electrode 33b formed thereon. In patterning the Pt film, the etching is performed under conditions for attaining high etching selectivity against the underlying TiAlN film, and in patterning the TiAlN film, the etching is performed under conditions for attaining etching selectivity sufficiently high for avoiding etching the underlying lower memory cell plug 20a of polysilicon.

Next, a BST ((BaSr)TiO$_3$) film with a thickness of approximately 30 nm, a Pt film with a thickness of approximately 30 nm, a TiAlN film with a thickness of approximately 6 nm and an NSG film are successively deposited so as to cover the second interlayer insulating film 22, the lower electrode 33a and the dummy lower electrode 33b. Thereafter, the NSG film is patterned into a hard mask (not shown), and the TiAlN film, the Pt film and the BST film are successively patterned by dry etching using the hard mask, so as to form a BST film 34 including a capacitor insulating film 34a and a capacitor insulating film extension 34b, a Pt film 35 including an upper electrode 35a and an upper electrode extension 35b, and an upper barrier metal 36 covering the Pt film 35. At this point, portions of the BST film, the Pt film, the TiAlN film and the NSG film positioned above the bit line plug 20b are removed so as to form an opening 59. Thereafter, the NSG film is selectively removed by using, for example, a diluted hydrofluoric acid solution.

Subsequently, after forming, for example, a TiAlN film with a thickness of 30 nm on the substrate, the TiAlN film is patterned by using a resist mask into a connection conductor film 37. At this point, the connection conductor film 37 covers the top face of the upper barrier metal 36, the wall of the opening 59 and the side faces of the upper barrier metal 36, the Pt film 35, the BST film 34, the lower electrode 33a and the dummy lower electrode 33b in an effective memory cell region Rec and a dummy cell region Rdc on the substrate, and also covers a part of the first interlayer insulating film 18. Thus, the connection conductor film 37 is in contact with the side faces of the upper electrode extension 35b and the dummy lower electrode 33b, and hence, the upper electrode extension 35b and the dummy lower electrode 33b are electrically connected to each other.

Next, in the procedure shown in FIG. 7B, after depositing a second interlayer insulating film 22, the second interlayer insulating film 22 is planarized by the CMP. Then, a contact hole 60 reaching the bit line plug 20b is formed through the second interlayer insulating film 22 and the connection conductor film 37. At this point, the contact hole 60 has a diameter sufficiently smaller than the inner diameter of the connection conductor film formed on the wall of the opening 59 in the procedure of FIG. 7A. Thereafter, after depositing a rather thin insulating film on the substrate, the insulating film is subjected to anisotropic etching, so as to form an insulating sidewall 52 on the wall of the contact hole 60. Then, a trench in contact with the lower interconnect plug 20d is formed through the second interlayer insulating film 22. A Cu film is deposited and subjected to the CMP, so as to fill the contact hole 60 and the trench above the lower interconnect plug 20d with the Cu film. Thus, an upper bit line plug 51 and a Cu interconnect 42 are formed.

Thereafter, a third interlayer insulating film 41 is deposited and planarized, a contact hole and a trench in contact with the upper bit line plug 51 are formed through the third interlayer insulating film 41, and the contact hole and the trench are filled with a Cu film, so as to form a bit line 53 (by the dual damascene method). As a result, the memory cell structure shown in FIG. 6 can be obtained.

In the fabrication method of this embodiment, a procedure for forming a contact hole above the Pt film 35 used for forming the upper electrode 35a (and the upper barrier metal 36) through the second interlayer insulating film 22 can be avoided. Therefore, similarly to the fabrication method of Embodiment 1, the characteristic degradation of the capacitor insulating film 34a derived from the exposure to a reducing atmosphere can be definitely suppressed.

Although the upper electrode 35a and the lower electrode 33a are made from Pt and the upper barrier metal 36 and the connection conductor film 37 are made from TiAlN in this embodiment, these members may be made from other conducting materials with oxidation resistance. Also, although the capacitor insulating film 34a is made from BST, another high-κ film material may be used instead. In particular, in the case where a dielectric film having the perovskite structure represented by ABO$_3$ is used, oxygen atoms can be easily lost through reduction, and hence, the present invention can be very effective in such a case.

Furthermore, it goes without saying that the present invention is applicable not only to an embedded device as in this embodiment but also to any semiconductor memory including a capacitor using a metal electrode, such as a generally used DRAM or FeRAM.

Embodiment 6

In Embodiment 1, the dummy lower barrier metal 32b and the dummy lower electrode 33b are formed. In this embodiment, in stead of forming these members, the connection conductor film 37 is in contact with the dummy cell plug 30b so that the upper electrode 35a and the dummy cell plug 30b can be electrically connected to each other.

Figure 8A:
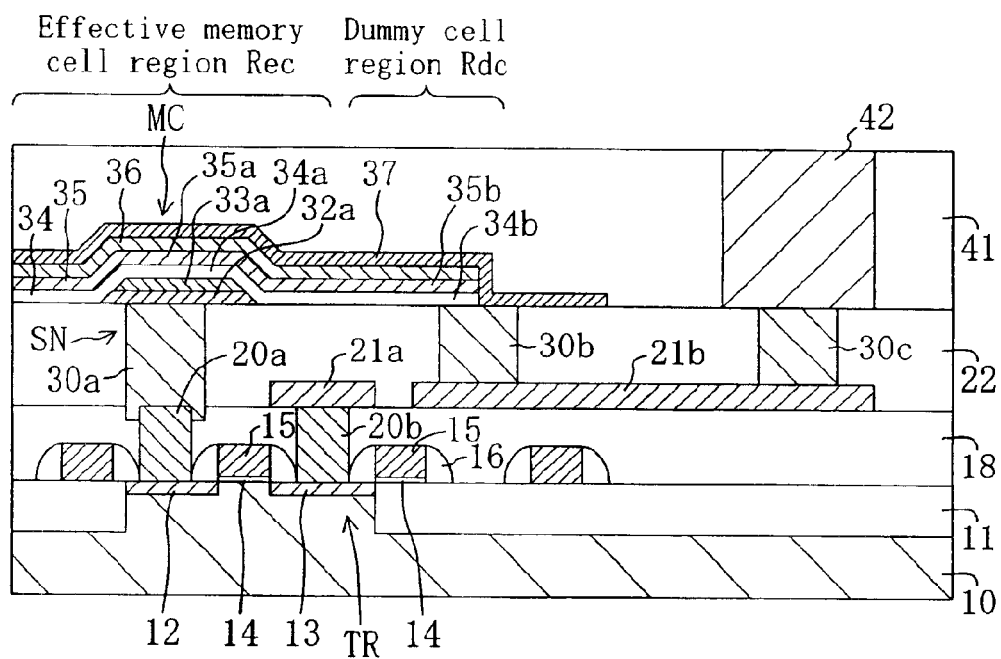
FIGS. 8A and 8B are respectively a cross-sectional view for partly showing a memory part and a plan view for showing an upper electrode and a connection conductor film included in a semiconductor memory according to Embodiment 6 of the invention.
Figure 8B:
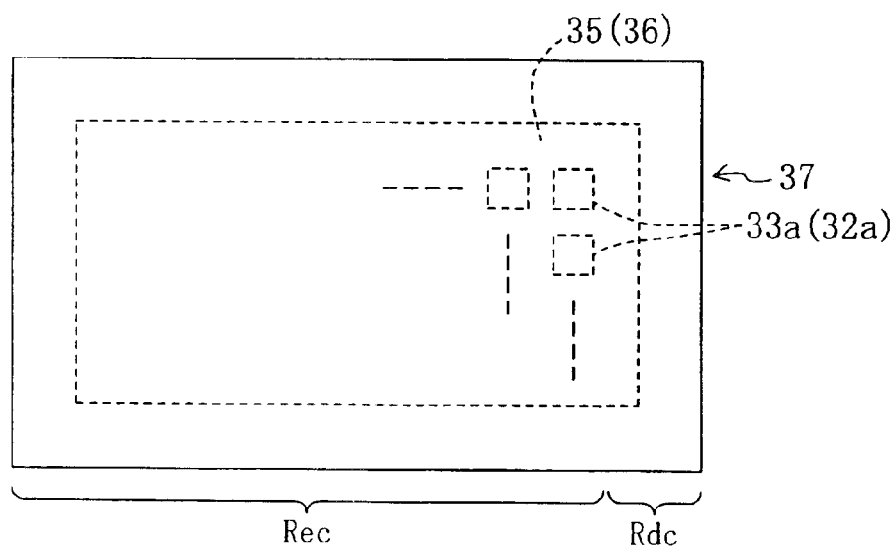

FIGS. 8A and 8B are respectively a cross-sectional view and a plan view for partly showing the structure of a memory part of a semiconductor memory according to Embodiment 6. Although the structure of the memory part alone is shown in each drawing referred to in this embodiment, the semiconductor memory of this embodiment is an embedded device in which a logic circuit element is provided in a logic circuit part not shown. However, the structure of the logic circuit element is not shown because it is not directly concerned with the essence of the invention.

As shown in FIG. 8A, the structure of the memory part of this embodiment is different from that of Embodiment 1 in that the dummy lower barrier metal 32b and the dummy lower electrode 33b are not provided in the dummy cell region Rdc. Furthermore, the capacitor insulating film extension 34b extending from the effective memory cell region Rec toward the dummy cell region Rdc, the upper electrode extension 35b covering the capacitor insulating film extension 34b and the upper barrier metal 36 are provided so as to partly expose the dummy cell plug 30b. The connection conductor film 37 is formed over the top and side faces of the upper barrier metal 36, the side faces of the upper electrode extension 35b and the capacitor insulating film extension 34b and at least a part of the dummy cell plug 30b.

In other words, while the connection conductor film 37, the dummy lower electrode 33b and the dummy lower barrier metal 32b are provided for electrically connecting the upper electrode extension 35b and the dummy cell plug 30b to each other in Embodiment 1, the dummy cell plug 30b is directly in contact with the connection conductor film 37 in this embodiment.

The capacitor insulating film extension 34b, the upper electrode extension 35b covering the capacitor insulating film extension 34b and the upper barrier metal 36 may be formed so as to partly expose the dummy cell plug 30b or so as to completely expose the dummy cell plug 30b. In the case where the dummy cell plug 30b is completely exposed, the connection conductor film 37 is formed so as not to be electrically connected to the lower electrode 33a and the lower barrier metal 32a and to cover at least a part of the dummy cell plug 30b. In other words, the connection conductor film 37 is electrically connected to the dummy cell plug 30b while being insulated from the lower electrode 33a.

As shown in FIG. 8B, the Pt film 35 used for forming the upper electrode 35a (and the upper barrier metal 36) is shared between a large number of memory cells, and a large number of lower electrodes 33a (and lower barrier metals 32a) are disposed below the Pt film 35. The remaining structure and effect are the same as those described in Embodiment 1 and hence the description is omitted.

Figure 9A:
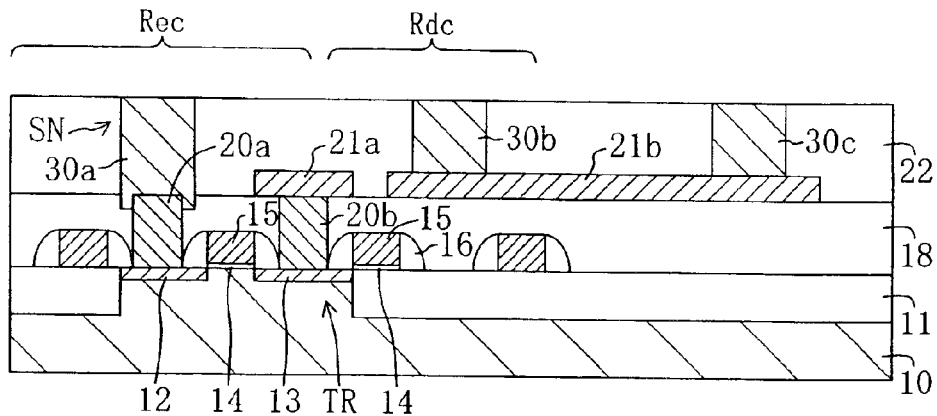
FIGS. 9A, 9B and 9C are cross-sectional views for showing procedures in a method for fabricating a semiconductor memory according to Embodiment 6 of the invention.
Figure 9B:
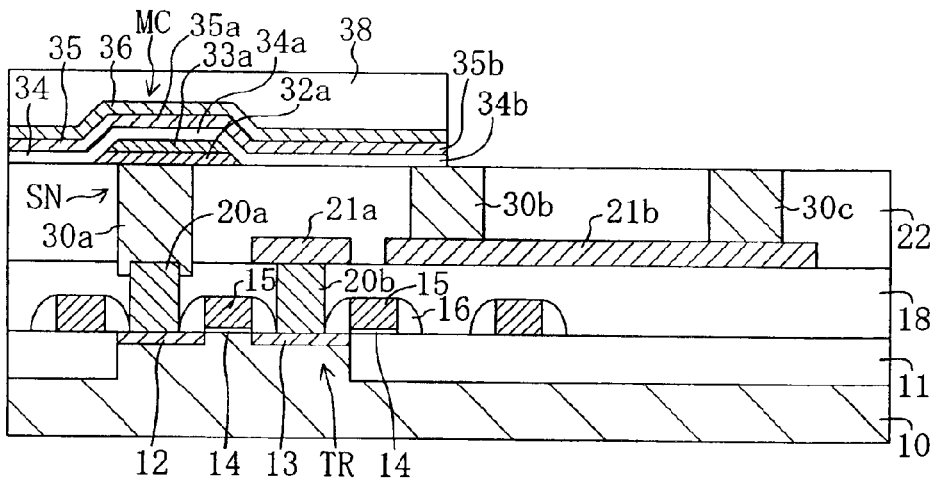
Figure 9C:
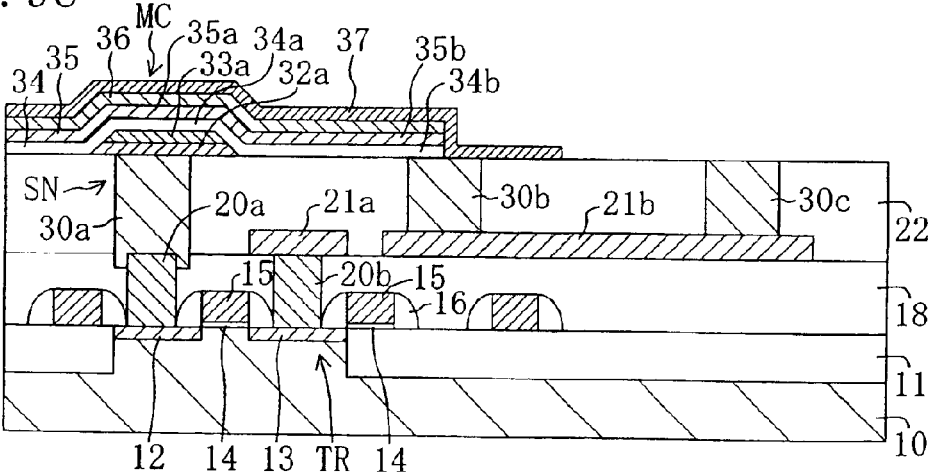

Next, a method for fabricating the memory cell of the semiconductor memory of this embodiment will be described with reference to FIGS. 9A through 9C. FIG. 9A through 9C are cross-sectional views for showing procedures in the fabrication method of Embodiment 6.

In the procedure shown in FIG. 9A, the following processing is performed: First, an isolation insulating film 11 surrounding an active region is formed in a p-type Si substrate 10, and a memory cell transistor TR composed of a source region 12, a drain region 13, a gate insulating film 14, a gate electrode 15 and an insulating sidewall 16 is formed on the active region. This memory cell transistor TR is formed through known procedures by using known techniques such as the thermal oxidation, the polysilicon film formation, the patterning and the ion injection.

Next, after depositing a BPSG film on the substrate having the memory cell transistor TR, the BPSG film is subjected to the annealing and the planarization by the CMP (chemical mechanical polishing), so as to form a first interlayer insulating film 18. Then, contact holes reaching the source region 12 and the drain region 13 are formed through the first interlayer insulating film 18. Thereafter, an n-type polysilicon film is formed within the contact holes and on the first interlayer insulating film 18, and the polysilicon film is planarized by the CMP, so as to fill the contact holes with the polysilicon film. Thus, a lower memory cell plug 20a and a bit line plug 20b are formed.

Next, after depositing W/Ti multilayer film on the first interlayer insulating film 18, the W/Ti multiplayer film is patterned by the etching, so as to form a bit line 21a connected to the bit line plug 20b and a local interconnect 21b not connected to any other member but isolated at this stage. In patterning the W film, the etching end point of the W film is determined by detecting time when the surface of the Ti film is exposed, and in patterning the Ti film, the etching is performed under conditions for attaining high etching selectivity against a lower memory cell plug 20a of polysilicon.

Then, after depositing a plasma TEOS film on the substrate, the plasma TEOS film is planarized by the CMP (chemical mechanical polishing), so as to form a second interlayer insulating film 22. Furthermore, contact holes reaching the lower memory cell plug 20a and two portions of the local interconnect 21b are formed through the second interlayer insulating film 22. After forming a W film within the contact holes, the W film is planarized by the CMP, so as to fill the contact holes with the W film. Thus, an upper memory cell plug 30a connected to the lower memory cell plug 20a, and a dummy cell plug 30b and an interconnect plug 30c respectively in contact with the two portions of the local interconnect 21b are formed.

Next, in the procedure shown in FIG. 9B, a TiAlN film with a thickness of approximately 6 nm and a Pt film with a thickness of approximately 50 nm are successively deposited on the second interlayer insulating film 22. The TiAlN film and the Pt film are patterned, so as to form, on the second interlayer insulating film 22, a lower barrier metal 32a connected to the upper memory cell plug 30a and a lower electrode 33a of Pt formed thereon. In patterning the Pt film, the etching is performed under conditions for attaining high etching selectivity against the underlying TiAlN film, and in patterning the TiAlN film, the etching is performed under conditions for attaining etching selectivity sufficiently high for avoiding etching the underlying upper memory cell plug 30a of W.

Thereafter, a BST ((BaSr)TiO$_3$) film with a thickness of approximately 30 nm, a Pt film with a thickness of approximately 30 nm, a TiAlN film with a thickness of approximately 6 nm and an NSG film are successively deposited so as to cover the second interlayer insulating film 22 and the lower electrode 33a. After patterning the NSG film into a hard mask 38, the TiAlN film, the Pt film and the BST film are successively patterned by the dry etching using the hard mask 38, so as to form an upper barrier metal 36 covering ht effective memory cell region Rec and the dummy cell region Rdc, a Pat film 35 including an upper electrode 35a and an upper electrode extension 35b and a BST film 34 including a capacitor insulating film 34a and a capacitor insulating film extension 34b. At this point, although the upper barrier metal 36, the upper electrode 35a and the upper electrode extension 35b are patterned so as to substantially completely cover the dummy cell plug 30b Embodiment 1, they are patterned so as to expose at least a part of the dummy cell plug 30b in this embodiment. Thereafter, the hard mask 38 is selectively removed by using, for example, a diluted hydrofluoric acid solution.

Subsequently, in the procedure shown in FIG. 9C, for example, a TiAlN film with a thickness of approximately 30 nm is formed on the substrate, and the TiAlN film is patterned by using a resist mask, so as to form a connection conductor film 37. At this point, the connection conductor film 37 covers the top face of the upper barrier metal 36 in the effective memory cell region Rec and the dummy cell region Rdc on the substrate, covers the side faces of the upper barrier metal 36, the upper electrode extension 35b and the capacitor insulating film extension 34b on the cross-sections in the dummy cell region Rdc, and covers at least a part of the top face of the dummy cell plug 30b.

Thereafter, a third interlayer insulating film 41 is deposited and planarized, a trench in contact with the interconnect plug 30c is formed through the third interlayer insulating film 41, and a Cu interconnect 42 is buried in the trench (by the damascene method). Thus, the memory cell having the cross-sectional structure shown in FIG. SA can be obtained.

In the fabrication method of this embodiment, a procedure for forming a contact hole above the Pt film 35 (and the upper barrier metal 36) through the third interlayer insulating film 41 and the connection conductor film 37 can be avoided without adding a new procedure to the conventional process. Accordingly, similarly to Embodiment 1, the characteristic degradation of the capacitor insulating film 34a derived from the exposure to a reducing atmosphere can be definitely suppressed without increasing the number of procedures.

Furthermore, since the top face and the side face of the upper barrier metal 36 and the side face of the upper electrode extension 35*b* can be covered with the connection conductor film 37 formed as one layer, a definite connection structure can be obtained. Also, since the whole top face of the upper barrier metal 36 is covered with the connection conductor film 37, the invasion of a reducing atmosphere can be suppressed.

In addition, since there is no need to provide a dummy lower electrode in this embodiment, the area occupied by the memory part can be advantageously reduced as compared with that of Embodiment 1.

The procedure for forming the Cu interconnect 42 corresponds to a conventional procedure for forming a plug to an upper electrode, and the local interconnect 21*b* and the interconnect contact 30*c* can be formed by utilizing the procedures for forming the memory cell.

Although the upper electrode 35*a* and the lower electrode 33*a* are made from Pt and the upper barrier metal 36 and the connection conductor film 37 are made from TiAlN in this embodiment, these members may be made from other conducting materials with oxidation resistance. Also, although the capacitor insulating film 34*a* is made from BST, another high-κ film material may be used instead. In particular, in the case where a dielectric film with the perovskite structure represented by $ABO_3$ is used, oxygen atoms can be easily lost through reduction, and hence, the present invention can be very effective in such a case.

Furthermore, it goes without saying that the present invention is applicable not only to an embedded device as in this embodiment but also to any semiconductor memory including a capacitor using a metal electrode, such as a generally used DRAM or FeRAM.

In this embodiment, the connection conductor film 37 is in contact with the dummy cell plug 30*b* without forming the dummy lower electrode 33*b* and the dummy lower barrier metal 32*b*, but it goes without saying that the connection conductor film 37 may be in contact with the dummy cell plug 30*b* with the dummy lower electrode 33*b* and the dummy lower barrier metal 32*b* formed.

Also, in this embodiment, the connection conductor film 37 is connected to the Cu interconnect 42 through the dummy cell plug 30*b*, the local interconnect 21*b* and the interconnect plug 30*c*, which corresponds to an exemplified application of the connection of Embodiment 1. According to the invention, the connection of Embodiment 3, 4 or 5 may be applied to this embodiment instead. In the case where, for example, the connection of Embodiment 5 is applied, the connection conductor film 37 is formed on the first interlayer insulating film 18 so as to be in contact with at least a part of the lower dummy cell plug 20*c*.

Embodiment 7

In Embodiment 7, a conducting sidewall is formed on the side faces of the upper electrode extension 35*b* and the capacitor insulating film extension 34*b* of Embodiment 6 instead of forming the connection conductor film 37.

Figure 10A:
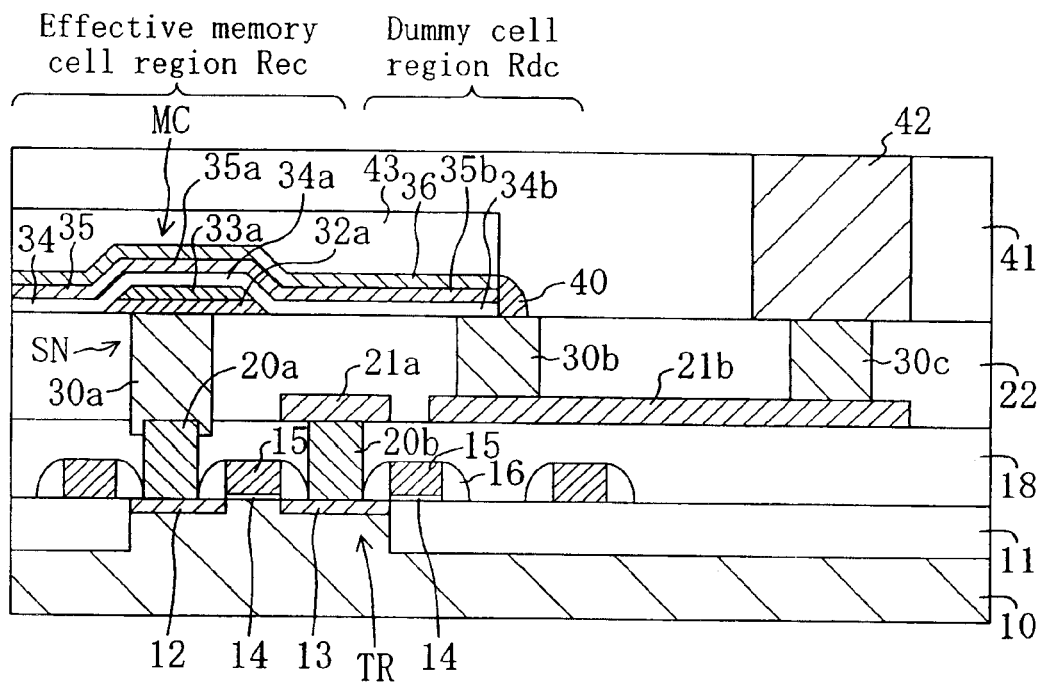
FIGS. 10A and 10B are respectively a cross-sectional view for partly showing a memory part and a plan view for showing an upper electrode and a conducting sidewall included in a semiconductor memory according to Embodiment 7 of the invention.
Figure 10B:
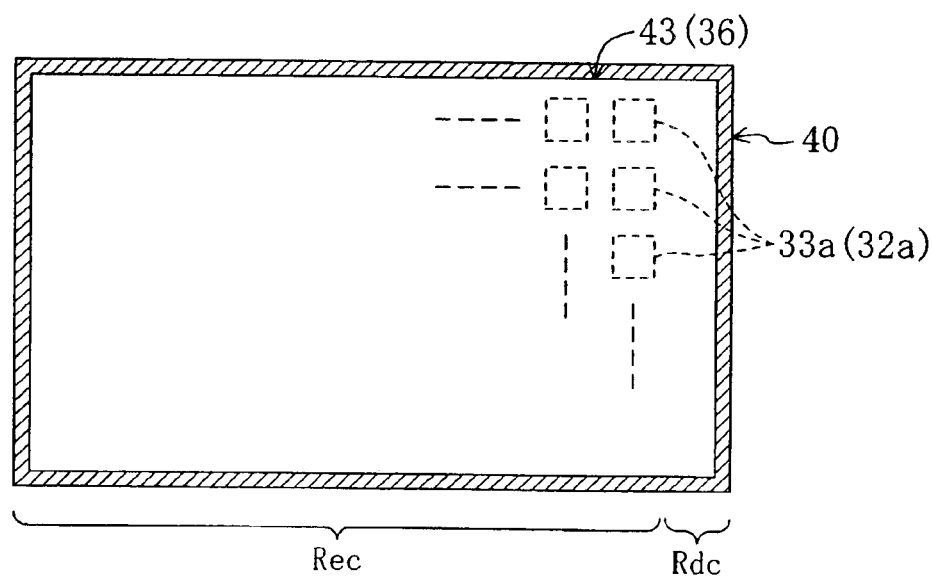

FIGS. 10A and 10B are respectively a cross-sectional view for partly showing the structure of a memory part and a plan view for showing an upper electrode and a conducting sidewall included in a semiconductor memory according to Embodiment 7. In each of the drawings referred to in this embodiment, the structure of the memory part alone is shown, but the semiconductor memory of this embodiment is an embedded device in which a logic circuit element is provided in a logic circuit part not shown. However, the structure of the logic circuit part is not shown because it is not directly concerned with the essence of the invention.

As shown in FIG. 10A, the structure of a memory cell of a DRAM, that is, the semiconductor memory of this embodiment, is different from that of Embodiment 6 in that a hard mask 43 is formed on the upper barrier metal 36, and that a conducting sidewall 40 of TiAlN is formed on the side faces of the hard mask 43, the upper barrier metal 36, the upper electrode extension 35*b* and the capacitor insulating film extension 34*b* so as to be in contact with at least a part of the top face of the dummy cell plug 30*b*. The conducting sidewall 40 entirely surrounds, as shown in FIG. 10B, the Pt film 35 and the BST film 34. In other words, the conducting sidewall 40 electrically connects the upper electrode extension 35*b* and the dummy cell plug 30*b* to each other. The remaining structure and effect are the same as those described in Embodiment 6 and hence the description is omitted.

Figure 11A:
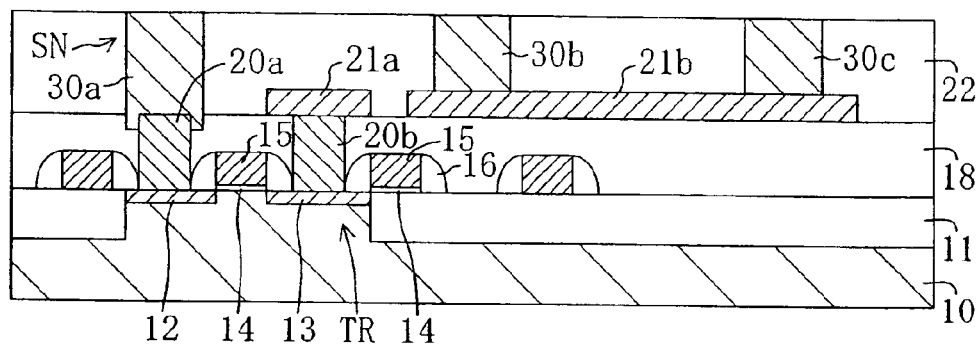
FIGS. 11A, 11B and 11C are cross-sectional views for showing procedures in a method for fabricating a semiconductor memory according to Embodiment 7 of the invention.
Figure 11B:
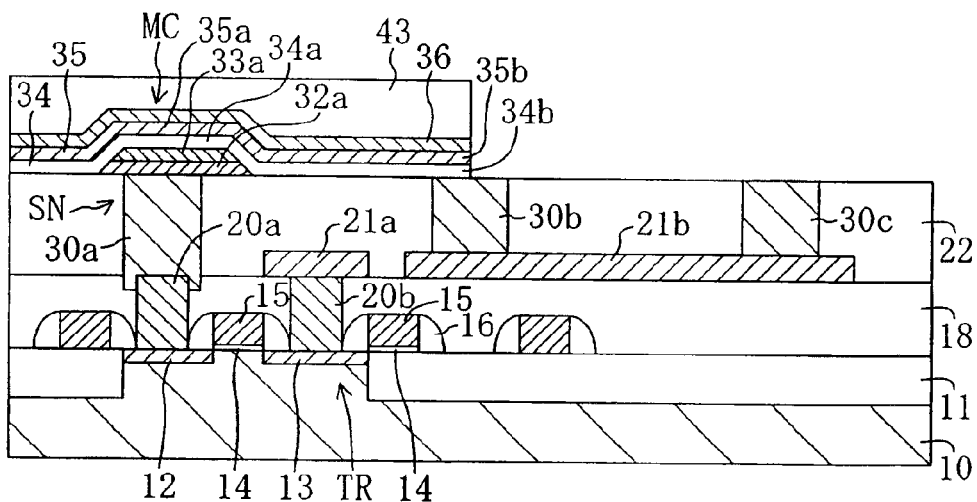
Figure 11C:
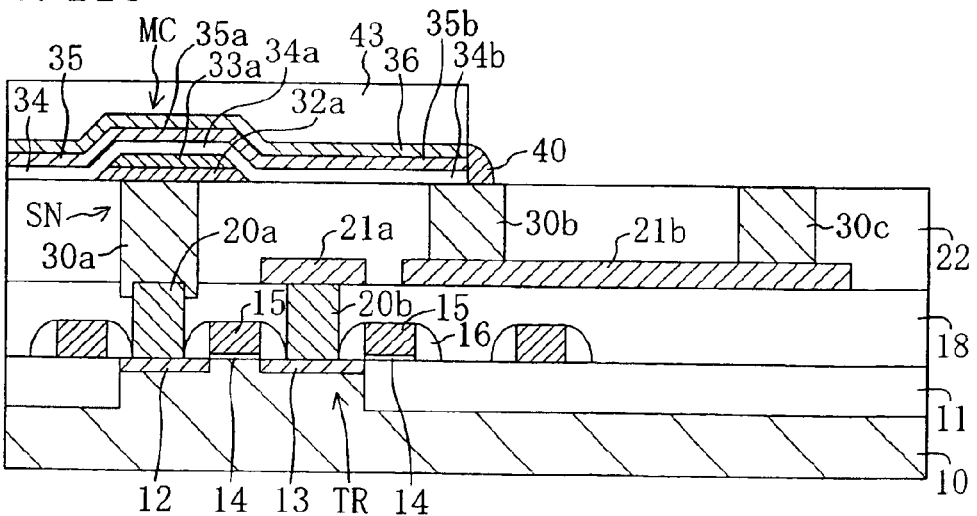

Now, a method for fabricating the memory cell of the semiconductor memory of this embodiment will be described with reference to FIGS. 11A through 11C. FIGS. 11A through 11C are cross-sectional views for showing procedures in the method for fabricating a semiconductor memory of this embodiment.

In the procedure shown in FIG. 11A, the following processing is performed: First, an isolation insulating film 11 surrounding an active region is formed in a p-type Si substrate 10, and a memory cell transistor TR composed of a source region 12, a drain region 13, a gate insulating film 14, a gate electrode 15 and an insulating sidewall 16 is formed on the active region. This memory cell transistor TR is formed through known procedures using known techniques such as the thermal oxidation, the polysilicon film formation, the patterning and the ion injection.

Next, after depositing a BPSG film on the substrate having the memory cell transistor, the BPSG film is subjected to the annealing and the planarization by the CMP (chemical mechanical polishing), so as to form a first interlayer insulating film 18. Furthermore, contact holes reaching the source region 12 and the drain region 13 are formed through the first interlayer insulating film 18. Then, an n-type polysilicon film is formed within the contact holes and on the first interlayer insulating film 18, and the polysilicon film is planarized by the CMP so as to fill the contact holes with the polysilicon film. Thus, a lower memory cell plug 20*a* and a bit line plug 20*b* are formed.

Then, after depositing a W/Ti multilayer film on the first interlayer insulating film 18, the W/Ti multilayer film is patterned by the etching, so as to form a bit line 21*a* connected to the bit line plug 20*b* and a local interconnect 21*b* not connected to any other member but isolated at this stage. In patterning the W film, the etching end point of the W film is determined by detecting time when the surface of the Ti film is exposed, and in patterning the Ti film, the etching is performed under conditions for attaining high etching selectivity against the lower memory cell plug 20*a* of polysilicon.

Next, after depositing a plasma TEOS film on the substrate, the plasma TEOS film is planarized by the CMP (chemical mechanical polishing), so as to form a second interlayer insulating film 22. Furthermore, contact holes reaching the lower memory cell plug 20*a* and two portions of the local interconnect 21*b* are formed through the second interlayer insulating film 22. Thereafter, a W/TiN/Ti film is formed within the contact holes and planarized by the CMP, so as to fill the contact holes with the W/TiN/Ti film. Thus, an upper memory cell plug 30*a* connected to the lower memory cell plug 20*a*, and a dummy cell plug 30*b* and an interconnect plug 30*c* respectively connected to the two portions of the local interconnect 21*b* are formed.

Subsequently, in the procedure shown in FIG. 11B, a TiAlN film with a thickness of approximately 30 nm and a Pt film with a thickness of approximately 30 nm are successively deposited on the second interlayer insulating film 22. Then, the TiAlN film and the Pt film are patterned, so as to form, on the second interlayer insulating film 22, a lower barrier metal 32a connected to the upper memory cell plug 30a and a lower electrode 33a of Pt formed thereon. In patterning the Pt film, the etching is performed under conditions for attaining high etching selectivity against the underlying TiAlN film, and in patterning the TiAlN film, the etching is performed under conditions for attaining etching selectivity sufficiently high for avoiding etching the underlying upper memory cell plug 30a of W.

Next, a BST ((BaSr)TiO$_3$) film with a thickness of approximately 30 nm, a Pt film with a thickness of approximately 30 nm, a TiAlN film with a thickness of approximately 30 nm and a SiO$_2$ film are successively deposited so as to cover the second interlayer insulating film 22 and the lower electrode 33a. Thereafter, the SiO$_2$ film is patterned into a hard mask 43, and the TiAlN film, the Pt film and the BST film are successively patterned by the dry etching using the hard mask 43. Thus, an upper barrier metal 36 covering the effective memory cell region Rec and the dummy cell region Rdc, a Pt film 35 including an upper electrode 35a and an upper electrode extension 35b, and a BST film 34 including a capacitor insulating film 34a and a capacitor insulating film extension 34b are formed. At this point, while the upper barrier metal 36, the upper electrode 35a and the upper electrode extension 34b are patterned so as to completely cover the dummy cell plug 30b in Embodiment 1, they are patterned so as to expose at least a part of the dummy cell plug 30b in this embodiment.

Subsequently, in the procedure shown in FIG. 11C, a TiAlN film, that is, a conductor film, with a thickness of approximately 50 nm is deposited on the substrate, and the TiAlN film is etched back by, for example, the anisotropic dry etching. Thus, a conducting sidewall 40 is formed so as to cover the side faces of the hard mask 43, the upper barrier metal 36, the Pt film 35 and the BST film 34 as shown in the cross-sectional view of FIG. 11C.

Furthermore, a third interlayer insulating film 41 is deposited and planarized, a trench in contact with the interconnect plug 30c is formed through the third interlayer insulating film 41 and a Cu interconnect 42 is buried within the trench (by the damascene method). Thus, the memory cell having the cross-sectional structure as shown in FIG. 10A can be obtained.

In the fabrication method of this embodiment, a procedure for forming a contact hole above the Pt film 35 (and the upper barrier metal 36) through the third interlayer insulating film 41 and the hard mask 43 can be avoided without increasing the number of photolithography procedures in the conventional process. Accordingly, similarly to the fabrication method of Embodiment 1, the characteristic degradation of the capacitor insulating film 34a derived from the exposure to a reducing atmosphere can be definitely suppressed without increasing the number of procedures.

In addition, since there is no need to provide a dummy lower electrode in this embodiment, the area occupied by the memory part can be advantageously reduced as compared with that of Embodiment 1.

Although the upper electrode 35a and the lower electrode 33a are made from Pt and the upper barrier metal 36 is made from TiAlN in this embodiment, these members may be made from other conducting materials with oxidation resistance. Also, although the capacitor insulating film 34a is made from BST, another high-κ film material may be used instead. In particular, in the case where a dielectric film with the perovskite structure represented by ABO$_3$ is used, oxygen atoms can be easily lost through reduction, and hence, the present invention can be very effective in such a case.

Furthermore, it goes without saying that the present invention is applicable not only to an embedded device as in this embodiment but also to any semiconductor memory including a capacitor using a metal electrode, such as a generally used DRAM or FeRAM.

In this embodiment, the conducting sidewall 40 is in contact with the dummy cell plug 30b without forming the dummy lower electrode 33b and the dummy lower barrier metal 32b, but it goes without saying that the conducting sidewall 40 may be in contact with the dummy cell plug 30b with the dummy lower electrode 33b and the dummy lower barrier metal 32b formed.

Also, in this embodiment, the conducting sidewall 40 is connected to the Cu interconnect 42 through the dummy cell plug 31b, the local interconnect 21b and the interconnect plug 30c, which corresponds to an exemplified application of the connection of Embodiment 1. According to the invention, the connection of Embodiment 3, 4 or 5 may be applied to this embodiment instead. In the case where, for example, the connection of Embodiment 5 is applied, the conducting sidewall 40 is formed on the first interlayer insulating film 18 so as to be in contact with at least a part of the lower dummy cell plug 20c.

OTHER EMBODIMENTS

Although the polysilicon film used for forming the gate line is used as the local interconnect in Embodiment 5, a structure similar to that of Embodiment 2 or 4 can be employed in the DRAM memory cell structure of the capacitor under bit-line as in Embodiment 5. Specifically, in the DRAM memory cell structure of the capacitor under bit-line, the local interconnect 23 made from a buried W film as shown in FIG. 3 or the local interconnect 25 made from an impurity diffusion layer as shown in FIG. 5 may be provided.

In each of the aforementioned embodiments, the application of this invention to an embedded semiconductor memory including both a DRAM and a logic circuit is described, which does not limit the invention but the invention can be applied to a generally used DRAM.

Also, the present invention is applicable to a semiconductor memory using a ferroelectric film as a capacitor insulating film, such as a FeRAM. Also in such application, the semiconductor memory may be a general memory or a memory/logic embedded device.

In each of Embodiments 1 through 5 and 7, the connection conductor film 37 completely covers the side faces of the Pt film 35 and the BST film 34 entirely around the Pt film 35 as shown in FIG. 1B. Therefore, the connection conductor film 37 can remarkably exhibit a function as a barrier layer for definitely preventing mixture of an impurity into the capacitor insulating film 34a. In this invention, however, the connection conductor film 37 need not always completely cover the side faces of the Pt film 35 and the BST film 34 entirely around the Pt film 35.

Also in each of Embodiments 2 through 5, the connection conductor film 37 is entirely covers the top face of the upper barrier metal 36 as shown in FIG. 1B. Therefore, the connection conductor film 37 can definitely prevent invasion of hydrogen and the like into the capacitor insulating film 34a. In this invention, however, the connection conductor film 37 need not always entirely cover the top face of the barrier metal 36.

It is noted that a dummy conducting member includes at least the dummy lower electrode 33b and the dummy cell plug 30b in Embodiments 1, 3, 4 and 5, includes at least the local interconnect 23 in Embodiment 2, and includes at least the dummy cell plug 30b in Embodiments 6 and 7.

What is claimed is:

1. A method for fabricating a semiconductor memory containing a memory capacitor including a lower electrode, an upper electrode and a capacitor insulating film disposed between said lower electrode and said upper electrode; a dummy conducting member electrically connected to said upper electrode; and an upper interconnect electrically connected to said dummy conducting member, comprising the steps of:

(a) forming said lower electrode by forming a first conductor film over an insulating layer on a semiconductor substrate and patterning said first conductor film;

(b) forming a dielectric film covering said lower electrode;

(c) forming a second conductor film covering said dielectric film;

(d) forming on said second conductor film, an etching mask covering a part of said lower electrode;

(e) patterning said second conductor film and said dielectric film, whereby forming said capacitor insulating film and a capacitor insulating film extension from said dielectric film and said upper electrode and an upper electrode extension from said second conductor film; and (f) depositing a third conductor film on said substrate after the step (e) and patterning said third conductor film, whereby forming a conducting member in contact with side faces of said upper electrode extension and said capacitor insulating film extension and electrically connected to said dummy conducting member.

2. The method for fabricating a semiconductor memory of claim 1,
   wherein said lower electrode and a dummy film spaced away from said lower electrode are formed by patterning said first conductor film in the step (a),
   a dummy lower electrode is formed as at least a part, of said dummy conducting member by patterning said dummy film in any step between the step (b) and the step (e), and
   said conducting member formed in the step (f) is in contact with side faces of said upper electrode extension, said capacitor insulating film extension and said dummy lower electrode and covers at least a part of a portion above said upper electrode extension.

3. The method for fabricating a semiconductor memory of claim 1, further comprising, before the step (a), a step of forming at least a part of said dummy conducting member in a region surrounded, on a side face thereof, with said insulating layer.
   wherein said conducting member formed in the step (f) is in contact with at least a part of a top face of said dummy conducting member.

4. The method for fabricating a semiconductor memory of claim 3,
   wherein said conducting member formed in the step (f) is a conductor film that is in contact with the side faces of said upper electrode extension and said capacitor insulating film extension and covers at least a part of a portion above said upper electrode extension.

5. The method for fabricating a semiconductor memory of claim 3,
   wherein said conducting member formed in the step (f) is a conducting sidewall in contact with the side faces of said upper electrode extension and said capacitor insulating film extension.

6. The method for fabricating a semiconductor memory of any of claims 1 through 5,
   wherein said dielectric film is a high-κ film or a ferroelectric film.

* * * * *